(12) United States Patent
Hattori

(10) Patent No.: US 11,718,014 B2
(45) Date of Patent: Aug. 8, 2023

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventor: Tadashi Hattori, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 447 days.

(21) Appl. No.: 16/837,914

(22) Filed: Apr. 1, 2020

(65) Prior Publication Data
US 2020/0316843 A1   Oct. 8, 2020

(30) Foreign Application Priority Data

Apr. 8, 2019  (JP) ................................. 2019-073610

(51) Int. Cl.
*B29C 59/02* (2006.01)
*B29C 59/00* (2006.01)
*G03F 7/00* (2006.01)
*B29C 59/16* (2006.01)

(52) U.S. Cl.
CPC ............ *B29C 59/02* (2013.01); *B29C 59/002* (2013.01); *G03F 7/0002* (2013.01); *B29C 59/16* (2013.01)

(58) Field of Classification Search
CPC ....... B29C 59/02; B29C 59/002; B29C 59/16; G03F 7/0002; H01L 21/027
See application file for complete search history.

(56) References Cited

U.S. PATENT DOCUMENTS

| | | | | |
|---|---|---|---|---|
| 2002/0180983 | A1* | 12/2002 | Ina | G01B 21/20 850/62 |
| 2007/0234786 | A1* | 10/2007 | Moon | G03F 7/0002 356/501 |
| 2010/0052217 | A1* | 3/2010 | Kasumi | G03F 7/0002 264/293 |
| 2014/0347644 | A1* | 11/2014 | Wu | G03F 9/7057 355/55 |
| 2016/0193759 | A1* | 7/2016 | Hattori | G03F 7/0002 425/141 |
| 2017/0246657 | A1* | 8/2017 | Tamura | G03F 7/0002 |
| 2019/0080922 | A1* | 3/2019 | Khusnatdinov | H01L 21/02288 |
| 2019/0255760 | A1* | 8/2019 | Hirano | B29C 59/002 |

FOREIGN PATENT DOCUMENTS

| | | | |
|---|---|---|---|
| JP | 64-23605 | A | 2/1989 |
| JP | 2005-101201 | A | 4/2005 |
| JP | 2007-205998 | A | 8/2007 |
| JP | 2007299994 | A * | 11/2007 |
| JP | 4185941 | B2 | 11/2008 |
| JP | 2016-127167 | A | 7/2016 |

* cited by examiner

*Primary Examiner* — Jerzi H Moreno Hernandez
(74) *Attorney, Agent, or Firm* — Canon U.S.A., Inc., IP Division

(57) ABSTRACT

An imprint apparatus that forms a curable composition on a substrate using a mold includes a first measurement unit configured to measure a height distribution of the substrate at a contact position where the mold and the curable composition are brought into contact with each other. The first measurement unit measures a height of the substrate by bringing a probe into contact with a surface of the substrate, the probe having a contact surface area smaller than a contact surface area of the mold.

7 Claims, 9 Drawing Sheets

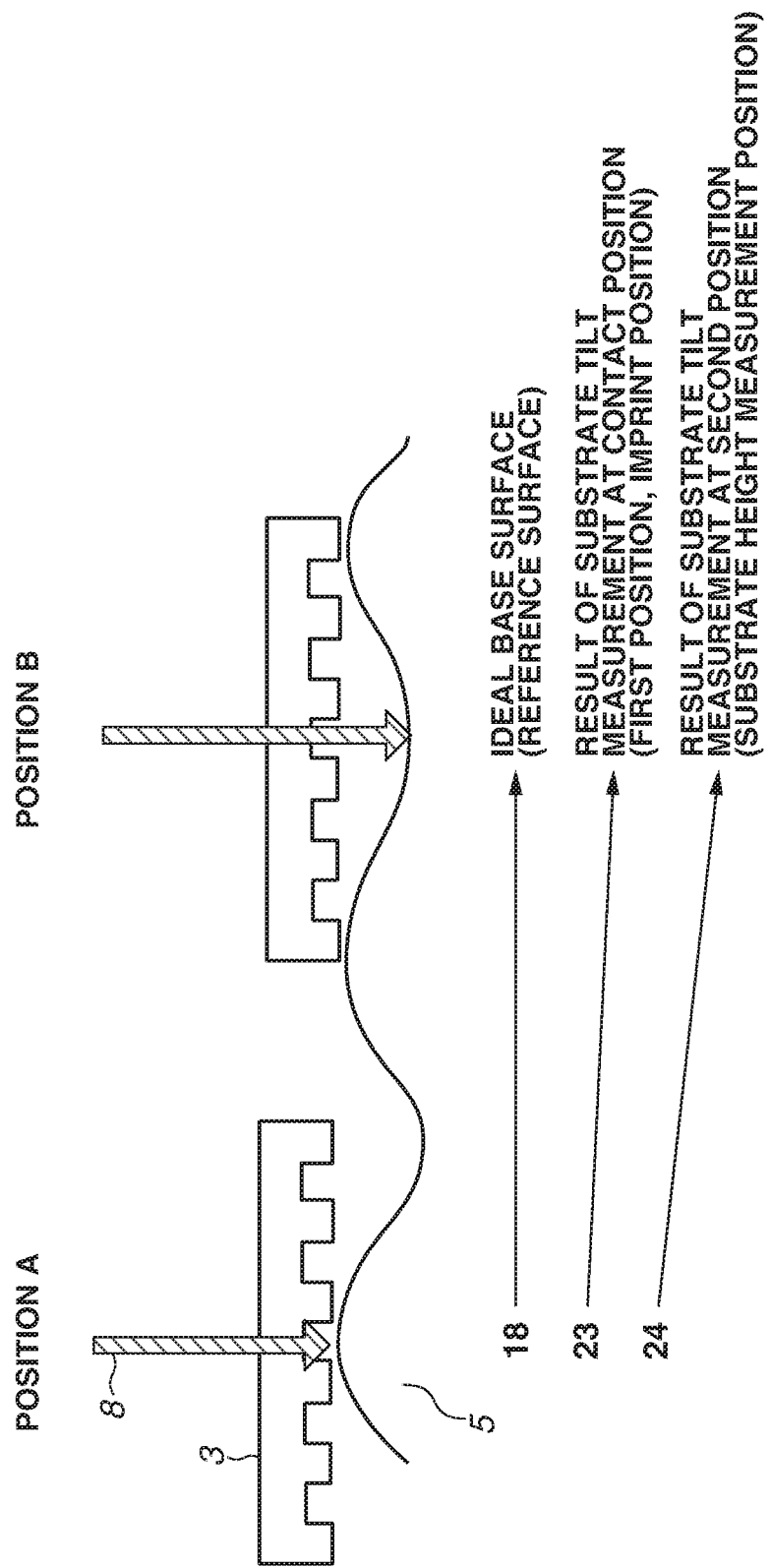

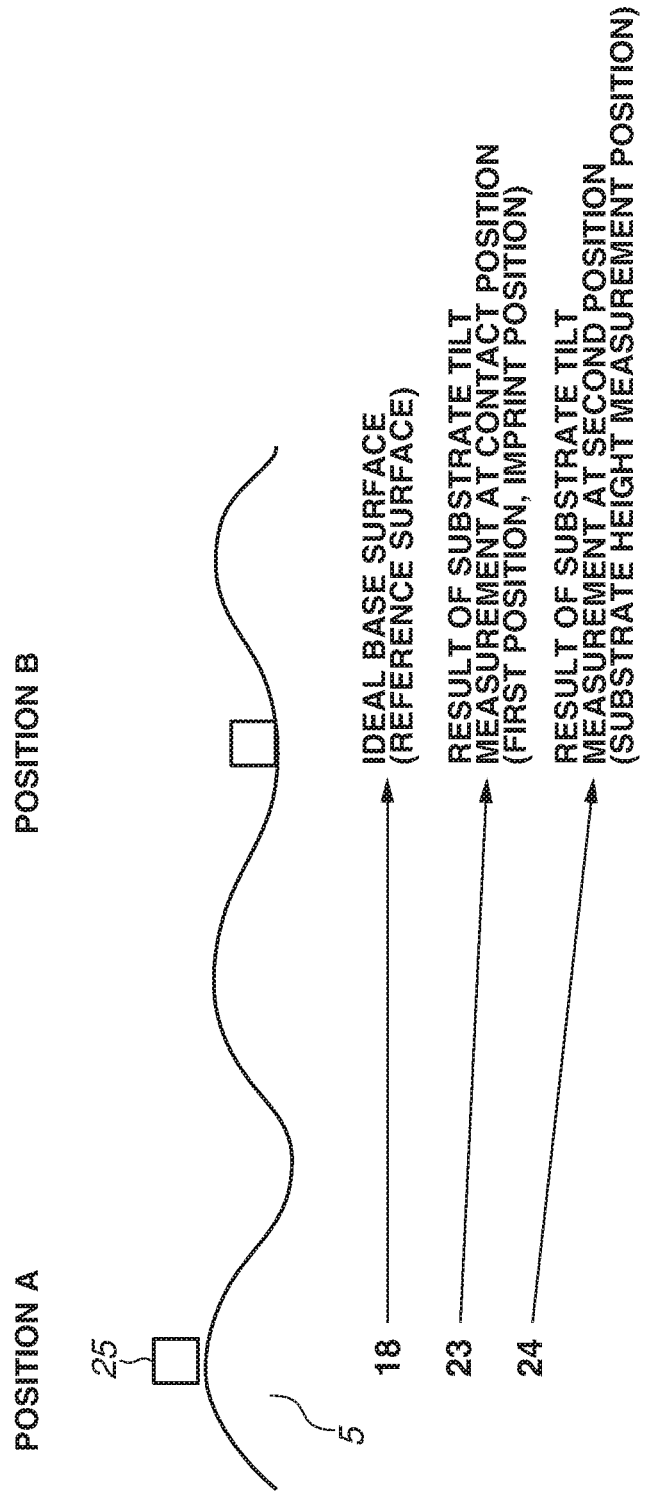

IMPRINT APPARATUS, IMPRINT METHOD, AND METHOD OF MANUFACTURING ARTICLE

BACKGROUND

Field of the Disclosure

The present disclosure relates to an imprint apparatus, an imprint method, and a method of manufacturing an article.

Description of the Related Art

With the recent progress in miniaturization of semiconductor devices, an imprint technique has been used as a semiconductor device manufacturing method. The imprint technique is a technique in which an imprint material is coated on a substrate, such as a silicon wafer, and a curable composition is cured in a state where a mold is pressed against the curable composition.

The imprint material, which is also referred to as a resin or resist, is hereinafter referred to as a curable composition. The mold, which is also referred to as an original or mask, is hereinafter referred to as a mold.

One example of the imprint technique is a photo-curing method as discussed in Japanese Patent No. 4185941.

An imprint apparatus to which the photo-curing method is applied coats a photo-curable composition on a pattern forming region (hereinafter referred to as a shot region) formed by carrying out a mold contacting process on a wafer substrate. Next, the mold is pressed against the curable composition. Further, the mold is irradiated with ultraviolet light and the photo-curable composition is cured and then released from the mold. As a result, a pattern of a cured product is formed on the substrate.

It is important for a nanoimprint apparatus to accurately bring a mold and a substrate into contact in parallel with each other.

Japanese Patent Application Laid-Open No. 2005-101201 discusses an imprint method in which a mold surface and a substrate surface are measured by a sensor, a tilt of the mold surface and a tilt of the substrate surface are obtained based on a movement direction (surface) of a substrate stage, and then the mold and the substrate are pressed in parallel.

However, when the base surface of the substrate stage is deformed even slightly, the reference for each tilt varies, which makes it difficult to press the mold and the substrate in parallel.

In this regard, Japanese Patent Application Laid-Open No. 2016-127167 discusses a method for actually bringing a mold into contact with a substrate at a plurality of positions on the substrate to measure a tilt of the substrate based on a height obtained during the mold contacting process.

Accurate concave-convex information about a substrate surface at an imprint position (a contact position between a curable composition on a substrate and a mold) is obtained to take the correlation between the obtained concave-convex information and concave-convex information about the substrate surface obtained at another position. As a result, accurate information about the tilt of the substrate can be obtained.

However, in the method in which information about a height at a contact position is obtained using a mold as discussed in Japanese Patent Application Laid-Open No. 2016-127167, information about a concave portion present between convex portions which are in contact with the mold cannot be obtained.

For this reason, the surface of the substrate does not necessarily match an expected surface of the substrate to be made parallel to the mold, and can be inclined from the expected surface depending on a distribution of convex portions.

Further, a surface measurement unit, such as an optical unit, can be provided at the imprint position. However, a plurality of mechanisms, such as a substrate movement unit, a mold movement unit, an ultraviolet light irradiation unit, an atmospheric gas introduction unit, and an alignment unit, is already arranged near the imprint position in many cases, which makes it quite difficult to additionally arrange the optical measurement unit in terms of apparatus design. In other words, there is a demand for a technique that makes it possible to simply and accurately estimate information about the substrate surface disposed at the above-described contact position, in particular, a tilt from the expected surface.

SUMMARY

The present disclosure has been directed in view of the above-described circumstances to providing a method for simply and accurately obtaining information about a tilt of a substrate surface without the need for adding a measurement optical system near an imprint position. According to an aspect of the present invention, an imprint apparatus that forms a curable composition on a substrate using a mold includes a first measurement unit configured to measure a height distribution of the substrate at a contact position where the mold and the curable composition are brought into contact with each other. The first measurement unit measures a height of the substrate by bringing a probe into contact with a surface of the substrate, the probe having a contact surface area smaller than a contact surface area of the mold.

Further features of the present disclosure will become apparent from the following description of exemplary embodiments with reference to the attached drawings.

BRIEF DESCRIPTION OF THE DRAWINGS

FIG. 3 illustrates a case where a substrate surface is measured by pressing the mold against the substrate.

FIG. 4 illustrates the exemplary embodiment in which the substrate surface is measured by pressing a probe against the substrate.

DESCRIPTION OF THE EMBODIMENTS

Exemplary embodiments of the present disclosure will be described below with reference to the accompanying drawings.

Figure 1:
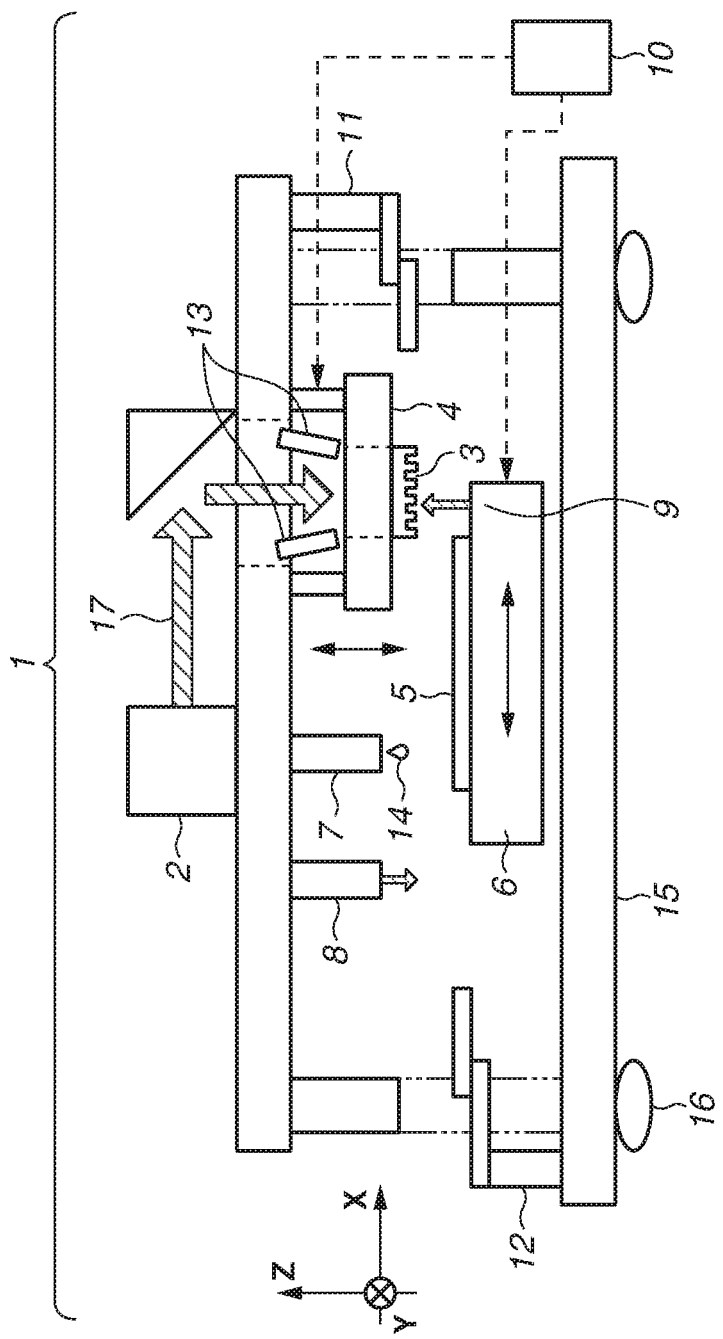
FIG. 1 illustrates an imprint apparatus according to an exemplary embodiment of the present invention.

A first exemplary embodiment will now be described. FIG. 1 illustrates an example of a structure of an imprint apparatus according to the first exemplary embodiment.

The imprint apparatus according to the first exemplary embodiment is a forming apparatus that is used for a semiconductor device manufacturing step and transfers a concave-convex pattern of a mold onto a silicon wafer substrate which is a processed substrate. The imprint apparatus employs a photo-curing method which is one example of an imprint technique.

In the drawings described below, a Z-axis is set in parallel with an ultraviolet light illumination axis with respect to the mold, an X-axis is set in a direction in which the substrate moves in a plane vertical to the Z-axis, and a Y-axis is set in a direction orthogonal to the X-axis.

An imprint apparatus 1 according to the first exemplary embodiment includes an illumination system unit 2, a mold 3, an imprint head 4, a substrate 5, a substrate stage 6, a curable composition coating device 7, a mold conveying device 11, a substrate conveying device 12, and a control device 10.

The illumination system unit 2 is an illumination unit that irradiates the mold 3 with ultraviolet light 17 during an imprint process. The illumination system unit 2 includes a light source and a plurality of optical elements for adjusting ultraviolet light emitted from the light source to light appropriate for imprinting.

The mold 3 is a mold having a structure in which a predetermined concave-convex pattern is three-dimensionally formed on a surface opposed to the substrate 5.

The imprint head 4 is a mold holding unit for holding and fixing the mold 3. The imprint head 4 includes a Z-driving mechanism for pressing the mold 3 against the substrate 5 in a state where the mold 3 is held. In this case, the imprint head 4 also includes a tilt correction driving mechanism for causing the entire mold 3 to be tilted depending on the tilt of the substrate 5 and the tilt of the mold 3.

At an upper portion of the mold 3 in the imprint head 4, a Through The Mask (TTM) scope 13 is provided as an alignment unit. The TTM scope 13 is an alignment scope including an optical system and an image capturing system for observing an alignment mark provided on the substrate 5 and an alignment mark provided on the mold 3.

A shift amount in the X-axis and Y-axis between the mold 3 and a shot portion on the substrate 5 can be measured by the TTM scope 13.

The substrate stage 6 is a substrate holding unit that holds the substrate 5, which is freely movable in an XY plane, by vacuum suction. The substrate stage 6 is desirably provided with a rotational driving mechanism about the Z-axis. The Z-driving or tilt correction driving mechanism of the imprint head 4 may be replaced by a rotational mechanism in the Z-direction or about the XY-axis.

The substrate stage 6 may be provided with a mold height sensor 9 capable of measuring the surface of the mold 3. The provision of the mold height sensor 9 enables measurement at each position of the surface of the mold 3 while driving the substrate stage 6 along the XY plane.

The substrate stage 6 is driven along a substrate stage base 15. In this case, a reference surface for the Z-direction or tilt used when the substrate stage 6 is driven in the XY direction corresponds to a surface of the substrate stage base 15. The substrate stage base 15 has a structure in which the substrate stage base 15 is isolated from vibration from a floor by a substrate stage base mount 16. In an example of the imprint apparatus 1 illustrated in FIG. 1, the entire imprint apparatus 1 is formed on the substrate stage base mount 16, thereby preventing the imprint apparatus 1 from being affected by the vibration from the floor.

In the present exemplary embodiment, as a first measurement unit that measures a height distribution of the substrate 5 at a contact position where the mold 3 and a curable composition are brought into contact with each other, a unit that measures the height of the substrate 5 by bringing a probe having a smaller contact surface area than that of the mold 3 into contact with a surface of the substrate 5 is provided. The first measurement unit will be described in detail below.

As a second measurement unit that measures a height distribution of the substrate 5 at a non-contact position different from the contact position, a substrate height sensor 8 capable of measuring the height of the substrate 5 is provided. The substrate height sensor 8 is a sensor capable of measuring the height of the substrate 5 by measuring the surface of the substrate 5. As the substrate height sensor 8, for example, an optical height measurement sensor, which measures a substrate height in a non-contact manner, is preferably used.

The non-contact position at which the second measurement is carried out is preferably located at a position remote from a mechanism, such as the imprint head 4 described above, which brings the mold 3 and the curable composition into contact with each other, so as to prevent the non-contact position from optically or physically interfering with the mechanism.

The substrate stage 6 is driven in the XY direction, thereby making it possible to measure a height distribution at each position from the reference surface of the substrate 5.

The curable composition coating device 7 is a coating unit that coats an uncured curable composition 14 on the substrate 5. The curable composition 14 is a photo-curable composition that is cured with the ultraviolet light 17 received from the illumination system unit 2.

The mold conveying device 11 is a conveying unit that conveys the mold 3 and places the mold 3 on the imprint head 4.

The substrate conveying device 12 is a conveying unit that conveys the substrate 5 and places the substrate 5 on the substrate stage 6.

The control device 10 is a control unit that controls an operation of each constituent unit of the imprint apparatus 1 and obtains sensor values and the like. The control device 10 includes, for example, a computer (not illustrated) or a sequencer, including a storage unit and being connected to each unit of the imprint apparatus 1 with a line.

Japanese Patent Application Laid-Open No. 2016-127167 discusses a method in which an imprint apparatus measures a tilt of a mold and a tilt of a substrate using a base surface of a substrate stage as a reference surface, and adjusts a substrate surface using the tilt of the mold and the tilt of the substrate so that the substrate surface is made parallel to the mold.

Figure 2A:
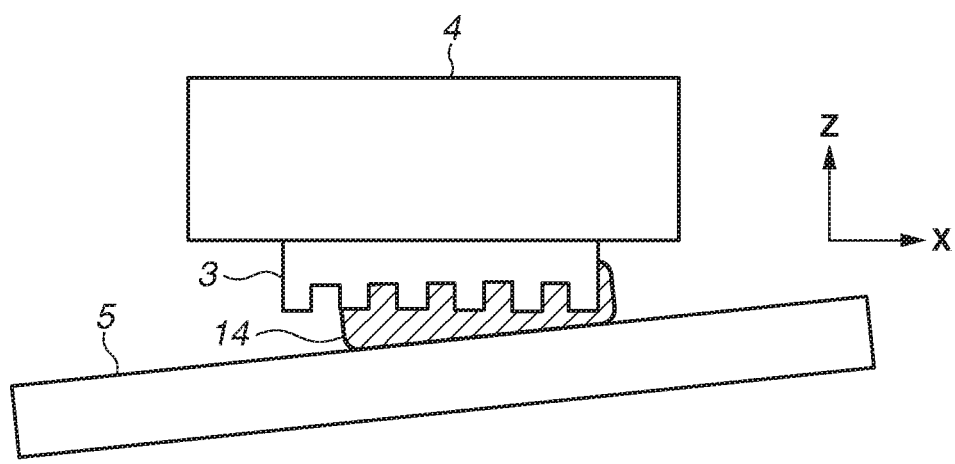
FIGS. 2A and 2B are conceptual diagrams each illustrating a state where imprinting is performed in a state where a mold and a substrate are not parallel to each other.
Figure 2B:
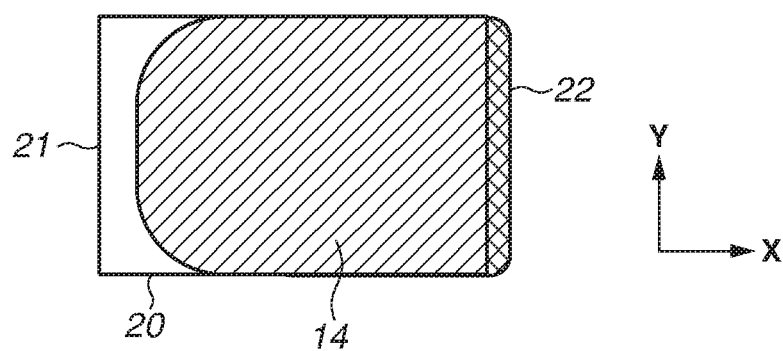

FIGS. 2A and 2B illustrate an effect of performing imprinting in a state where the mold 3 and the substrate 5 are not parallel to each other.

As illustrated in FIG. 2A, in a case where the mold 3 and the substrate 5 are not parallel to each other, an unfilled portion occurs in a shot portion at a certain position (indicated by a location 21 in FIG. 2B) within the shot portion. On the other hand, at an opposite location (indicated by a location 22 in FIG. 2B), the curable composition penetrates to the outside of the shot portion, which causes a defect in the adjacent shot portion. In addition, a non-uniformity in the thickness of the curable composition occurs in the shot portion, which has an adverse effect on the uniformity or the like of a line width of a pattern due to the effect of the subsequent process.

As described above, the substrate height sensor 8 used for the second measurement to be performed at the non-contact position can be disposed at a location remote from the imprint position so as to prevent the substrate height sensor 8 from interfering with the mold 3 and a mold holding mechanism (which is referred to as the imprint head).

In this case, the substrate 5 is mounted on the substrate stage 6, and the tilt of the substrate 5 is measured at a location different from the imprint position.

On the other hand, a measurement using a probe according to the present exemplary embodiment can be made at the contact position (imprint position), or at a position near the contact position.

In recent years, there is an increasing demand for miniaturization of patterns, an increase in productivity depending on a filling performance near a shot portion, a reduction of defects due to penetration of a curable composition from a peripheral area of a shot portion, and the like. As a result, there is an increasing demand for an increase in degree of parallelization when a substrate and a mold are brought into contact with each other.

Specifically, in a system discussed in Japanese Patent Application Laid-Open No. 2016-127167, if the shape of the substrate surface is substantially flat and only the tilt of the substrate surface cannot be accurately measured due to the effect of movement of the substrate stage 6, or if the shape of the substrate surface is a lower-order function shape (e.g., a quadratic function shape or a cubic function shape), there is no problem. However, the measurement accuracy may deteriorate depending on the state of the concave-convex pattern of the substrate surface.

In the structure discussed in Japanese Patent Application Laid-Open No. 2016-127167, if the reference surface of the base of the substrate stage varies depending on the position of the substrate stage, the reference for the tilt varies, which makes it difficult to press the mold and the substrate in parallel.

Accordingly, in the present exemplary embodiment, a probe is actually brought into contact with the substrate 5 at a plurality of positions on the substrate 5, and a tilt of the substrate 5 is measured based on a height obtained during the mold contacting process.

Consequently, the degree of parallelization between the substrate 5 and the mold 3 at the imprint position can be measured without the influence of the surface of the base of the substrate stage 6.

This concept will be described with reference to FIG. 3. The illustration in FIG. 3 is exaggerated to some extent for ease of explanation.

FIG. 3 illustrates both the process of performing measurement by the substrate height sensor 8 and the process of pressing the mold 3 against the substrate 5. However, in practice, the both processes are carried out at different locations on the substrate stage 6. FIG. 3 is merely a conceptual diagram illustrating an example where the measurement is made at the same point on the substrate 5.

In the example illustrated in FIG. 3, the substrate height is measured at two positions, i.e., a position A and a position B, on the substrate 5 and the tilt of the substrate 5 is obtained.

This process is carried out by both the substrate height sensor 8 and the unit that measures the height by pressing the mold 3 at the imprint position. Assume that, in both cases, the surface of the substrate stage base is ideal (horizontal with respect to the drawing sheet as indicated by a surface 18 in FIG. 3).

The substrate height sensor 8 has an extremely small measurement region (about several tens of μm-square to several hundred of μm-square). At the position A illustrated in FIG. 3, convex portions of the concave-convex pattern of the substrate 5 are measured, and at the position B illustrated in FIG. 3, concave portions of the concave-convex pattern of the substrate 5 are measured.

As a result, the tilt of the substrate 5 measured at the two points A and B is calculated as indicated by a tilt 24 in FIG. 3.

At the imprint position, a mesa surface (a projecting surface in contact with the curable composition) of the mold 3 has a certain size. Accordingly, at the position A, a height that is substantially the same as the height obtained by the substrate height sensor 8 is measured, while at the position B, a height that is different from the height obtained by the substrate height sensor 8 is measured.

As a result, the tilt of the substrate 5 is calculated as indicated by a tilt 23 in FIG. 3.

As a result, it is determined that the difference between the tilt 23 and the tilt 24 illustrated in FIG. 3 corresponds to the difference between the surface of the substrate stage base at the substrate height measurement position and the surface of the substrate stage base at the imprint position.

As described above, FIG. 3 is a conceptual diagram depicted for better understanding of the concept. In practice, the mold 3 is also deformed slightly along the substrate surface.

Accordingly, to be more specific, it can be considered that the result of height measurement at the imprint position is obtained by averaging heights with the area of mesa portions of the mold 3.

In the example illustrated in FIG. 3, the measurement is made at the two positions on the substrate 5 assuming that the difference in the surface of the substrate stage base is linear. However, in order to more precisely measure the effect of the surface of the substrate stage base, the measurement may be desirably made with a finer pitch at more points on the substrate 5.

Also, in this case, a fine concave-convex pattern on the substrate 5 cannot be accurately measured in the measurement of the height at the imprint position. Accordingly, the difference in the surface of the substrate stage base cannot be accurately calculated.

The present invention is directed to providing a unit that more accurately measures a distribution of concave-convex portions of the substrate surface at the imprint position, thereby measuring the degree of parallelization between the substrate surface and the mold 3 during imprinting.

Therefore, a probe having a contact surface with a contact area smaller than that of the mold 3 is used to measure the shape of the substrate surface at the imprint position.

The size of the contact surface of the probe that contacts the substrate 5 is preferably smaller enough to contact each concave portion than the concave-convex pattern of the substrate surface. The size of the contact surface of the probe with respect to an area A of the contact surface of the mold 3 is 0.2 A or less, preferably 0.1 A or less, and more preferably 0.01 A or less.

More preferably, the contact surface of the probe has the same surface area and shape as those of a region on the substrate measured by the second measurement unit (substrate height sensor 8). Specifically, depending on the size of the mold 3 and the substrate 5, for example, the contact surface of the probe is 1-cm square or less, preferably 5-mm square or less, and more preferably 1-mm square or less.

Further, it is preferable to use a probe having a shape similar to the shape of the mold 3. A probe having a structure in which the shape of the probe is similar to the shape of the mesa portion of the mold 3 and the size of the probe is smaller than the size of the mesa portion of the mold 3 is preferably used because this structure enables the same mold holding unit to easily hold the probe. In this case, during measurement of the height distribution of the substrate 5 at the contact position, it is preferable to cause the mold holding unit to hold the probe, and during the process of contacting the curable composition, it is preferable to cause the mold holding unit to hold the mold 3. More preferably, the imprint apparatus 1 includes a mechanism for switching between the mold and the probe to be held by the mold holding unit depending on the timing.

A first measurement process of measuring the height distribution of the substrate 5 at the imprint position (contact position) using a planar probe, which has a shape similar to that of the mold 3 used for imprinting and includes a mesa portion, a second measurement process of measuring the height distribution at the non-contact position remote from the contact position, and a method for performing imprinting in a state where the mold 3 and the substrate 5 are in parallel by using the measurement results will be described below.

Steps of these processes will be described with reference to a flowchart illustrated in FIG. 5. Conceptual diagrams illustrating operations corresponding to the respective steps will be described with reference to FIGS. 6A to 6E, 7, and 8. To facilitate understanding, FIGS. 6A to 6E and 7 are based on the premise that the substrate stage 6 includes a tilt correction driving mechanism.

Figure 5:
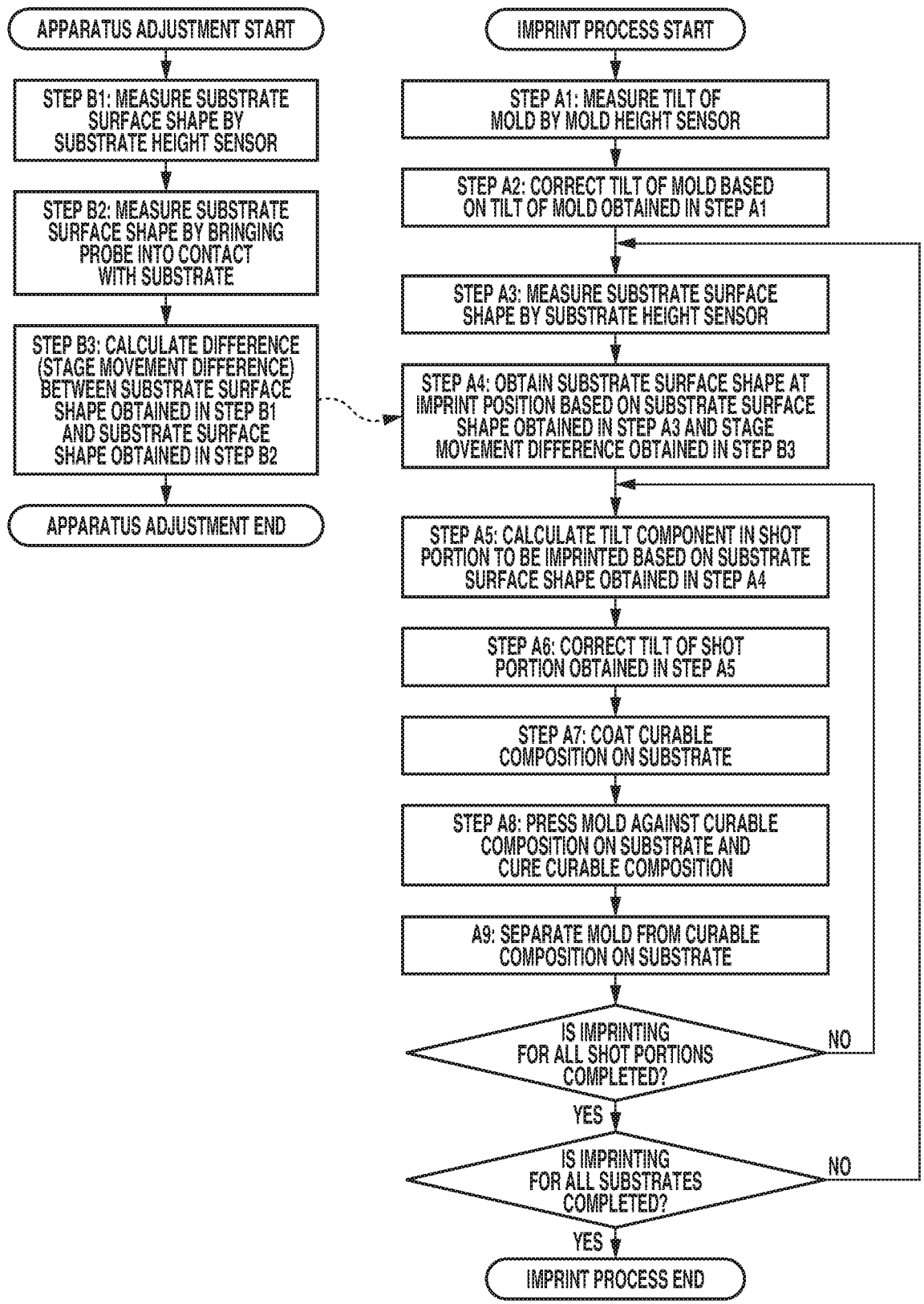
FIG. 5 is a flowchart illustrating a process flow in which the mold and the substrate are made parallel to each other according to the exemplary embodiment.

The steps illustrated in FIG. 5 include steps to be carried out during apparatus adjustment and steps to be carried out during actual production, i.e., during imprinting performed on the substrate for production.

Specifically, steps B1 to B3 illustrated in FIG. 5 are carried out during apparatus adjustment.

If the state of the imprint apparatus 1 does not change, that is, if the surface of the substrate stage base does not change, this adjustment operation may be carried out only once.

In practice, the shape of the imprint apparatus 1 is mechanically deformed with time. Accordingly, the adjustment operation may be carried out every certain period, e.g., every several months, or every several years.

Steps A1 to A9 illustrated in FIG. 5 are carried out during the actual production substrate process.

In this case, only the information obtained during the adjustment operation described above is used, and thus the productivity (throughput, i.e., the number of substrate processes per unit time) is not degraded by carrying out the present proposal.

Each of the steps will be described in detail below.

Steps to be carried out during apparatus adjustment will now be described.

In step B1, a substrate height distribution is measured using the substrate height sensor 8. The operation to be carried out in step B1 will be described with reference to FIG. 6A.

The substrate stage 6 is driven to the position of the substrate height sensor 8 fixed to the imprint apparatus 1. To measure the entire surface of the substrate 5, a system for performing a scanning measurement while driving the substrate stage 6 may be employed.

The height distribution of the substrate 5 measured at this time is affected by the surface of the substrate stage base at this location, i.e., at the substrate height measurement position.

Figure 6A:
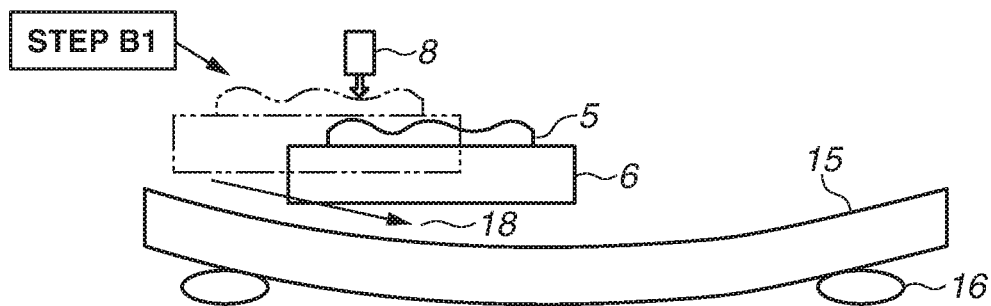
FIGS. 6A to 6E are conceptual diagrams each illustrating an apparatus adjustment process according to the exemplary embodiment.
Figure 6B:
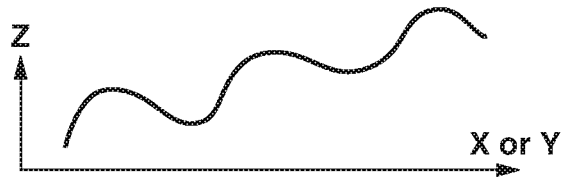

FIG. 6B illustrates the measurement result. In the example illustrated in FIG. 6A, the substrate stage 6 is moved downward toward the right side of the drawing sheet.

When the substrate stage 6 is moved toward the right side of the drawing sheet, the left side on the substrate is measured.

The left side of the substrate 5 is measured as a low position.

Specifically, the substrate surface shape is measured as an upward-sloping shape as illustrated in FIG. 6B.

In step B2, the substrate height distribution at the imprint position is obtained using the same substrate 5 as that used in step B1.

Figure 6C:
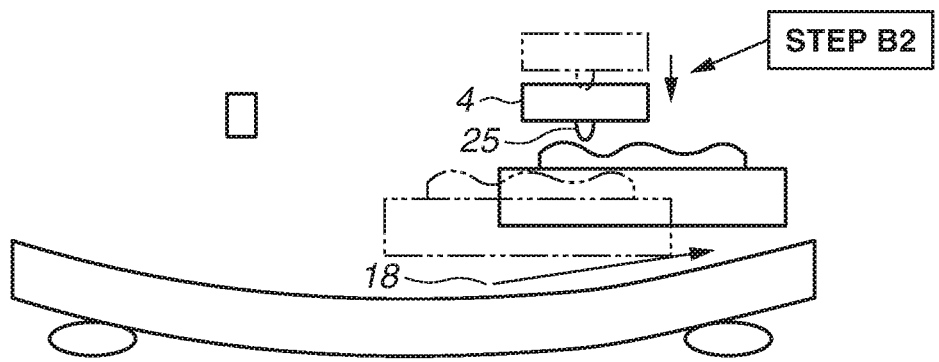

The use of a probe 25 having a small contact surface that contacts the curable composition is one feature of the present invention. FIG. 6C illustrates the operation to be carried out in this case.

A contact surface (corresponding to a mesa surface) of a terminal (corresponding to a mesa portion) of the probe 25 is brought into contact with the substrate surface so that the contact surface contacts the substrate 5, that is, the probe 25 is pressed against the substrate 5, thereby measuring the substrate height based on the amount of driving in the Z-direction of the imprint head 4 at the time.

Like in step B1, this process is carried out on the entire surface of the substrate 5 while driving the substrate stage 6, and the height distribution of the substrate 5 is measured.

Figure 6D:
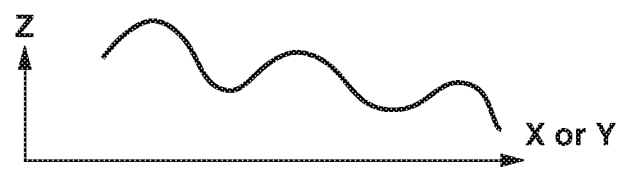

The height distribution of the substrate 5 measured in this case is affected by the reference surface of the substrate stage base at this location, i.e., at the imprint position. FIG. 6D illustrates the measurement result.

In the example illustrated in FIG. 6C, the substrate stage 6 is moved upward toward the right side of the drawing sheet. When the substrate stage is moved toward the right side of the drawing sheet, the left side on the substrate 5 is measured.

The left side of the substrate 5 is measured as a high position. Specifically, the height distribution of the substrate 5 is measured as a downward-sloping shape as illustrated in FIG. 6D.

FIG. 6C illustrates an example where the imprint head 4 is driven downward, thereby bringing the substrate 5 and the probe into contact with each other. However, the present exemplary embodiment is not limited to this example. The substrate stage 6 may be moved upward.

When the substrate 5 and the probe 25 are brought into direct contact with each other, the substrate 5 and the probe 25 may be damaged. Accordingly, a protective film may be generally formed on the substrate 5 in advance, or the curable composition used for the imprint process may be coated on the substrate 5.

The above-described contacting process may be repeated at a plurality of positions on the substrate 5 under the same conditions.

Hereinafter, for convenience of explanation, a state where the probe 25 is in contact with the protective film or curable composition on the substrate 5 is expressed as a state where the probe 25 and the substrate 5 are in contact with each other.

The state where the probe 25 and the substrate 5 come into contact with each other may be detected by, for example, calculating a force to be applied to the imprint head 4 based on a value of current flowing through the imprint head 4 and detecting the state based on a variation of the force, or may be detected by a force sensor that is incorporated in the imprint head 4 in advance.

The amount of driving in the Z-direction of the imprint head 4 upon detection of the state where the probe 25 and the substrate 5 come into contact with each other is stored. The amount of driving in the Z-direction of the imprint head 4 corresponds to the substrate height.

FIG. 4 illustrates detailed measurement results in comparison with FIG. 3 to explain advantageous effects of the present invention obtained.

Although the illustration of the substrate height sensor 8 illustrated in FIG. 3 is omitted in FIG. 4, the measurement is made at the substrate position that is the same as the measurement position of the substrate height sensor 8.

In FIG. 3, the same measurement result as that obtained by the substrate height sensor 8 cannot be obtained due to the effects of the concave-convex pattern of the substrate 5 and the size of the mesa portion. On the other hand, in FIG. 4, the use of a probe 25 having a small contact area makes it possible to obtain substantially the same measurement result as that obtained by the substrate height sensor 8.

As a result, the substrate tilt 23 at the imprint position illustrated in FIG. 4 and the substrate tilt 24 at the substrate height sensor position illustrated in FIG. 4 show the same results, and the difference in the surface of the substrate stage base (which is ideal in FIG. 4, i.e., it is assumed that there is no difference therebetween) can be accurately calculated.

FIG. 4 illustrates an example where the measurement is made only at two points on the substrate 5. As seen from FIG. 4, the measurement of the entire surface of the substrate 5 using the probe 25 according to the present exemplary embodiment makes it possible to more accurately measure the height distribution indicating the shape of the substrate surface.

In step B3, the difference between the height distribution of the substrate 5 at the substrate height measurement position obtained in step B1 as illustrated in FIG. 6B and the height distribution of the substrate 5 at the imprint position obtained in step B2 as illustrated in FIG. 6D is calculated.

In the example illustrated in FIGS. 6A to 6E, the substrate shape illustrated in FIG. 6B is the same as that in FIG. 6D, and only the direction (linear component) of the surface of the base of the substrate stage 6 illustrated in FIG. 6B is different from that in FIG. 6D.

Figure 6E:
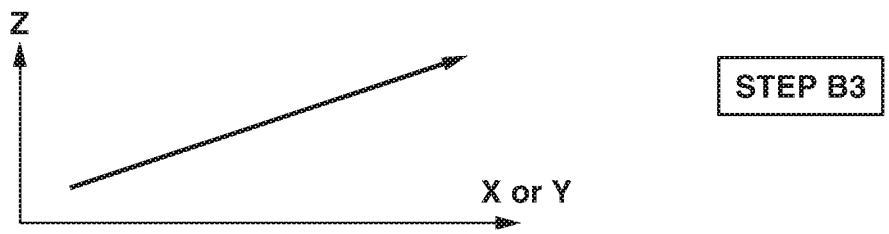

Specifically, FIG. 6B differs from FIG. 6D in terms of the surface of the base of the substrate stage 6, and only the tilt (linear) component as illustrated in FIG. 6E is left.

FIG. 6E illustrates an upward-sloping shape. This shape is obtained because the imprint position is set as the reference for movement of the substrate stage 6, that is, the formula [graph of FIG. 6B]-[graph of FIG. 6D] is calculated.

The reference to be used can be arbitrarily selected in conformity with step A4 to be described below.

Note that steps B1 and B2 described above are to be carried out on the same substrate 5.

Specifically, even though the height distribution of the substrate 5 at the substrate height measurement position and the height distribution of the substrate 5 at the imprint position are obtained using the same substrate, there is a difference between the height distributions. This indicates that the surface of the base of the substrate stage 6 varies.

If a substrate of a favorable origin, such as a super flat substrate, is used, there is no need to use the same substrate 5 in steps B1 and B2.

In steps B1 and B2, the measurement may be desirably made at the same point on the substrate 5.

This is because, in the case of calculating the difference in step B3, the calculation is facilitated.

However, if the substrate of favorable origin, such as the above-described super flat substrate, is used, the height distribution of the substrate can be represented by approximation of functions to some extent.

In such a case, the height distribution need not necessarily be measured at the same location on the substrate 5 in steps B1 and B2.

In the example illustrated in FIGS. 6A to 6E, the surface of the base of the substrate stage 6 is represented by a linear function, i.e., illustrated using only the tilt to facilitate understanding. However, the present exemplary embodiment is not limited to this example.

If the surface of the base of the substrate stage 6 has a higher-order function or a higher spatial frequency component, the measurement of the substrate surface in steps B1 and B2 may be made with a sufficiently fine pitch.

Next, steps to be carried out during imprinting in the production substrate process will be described with reference to the flowchart illustrated in FIG. 5 and FIG. 7. These steps are basically the same as steps in Japanese Patent Application Laid-Open No. 2016-127167, and thus the steps in Japanese Patent Application Laid-Open No. 2016-127167 can be referenced.

Japanese Patent Application Laid-Open No. 2016-127167 discuses only the tilt of the entire surface of the substrate. On the other hand, in the present exemplary embodiment, the tilt for each shot portion in the concave-convex pattern of the substrate surface is taken into consideration to make the substrate surface and the mold 3 parallel to each other with a high accuracy.

Figure 7:
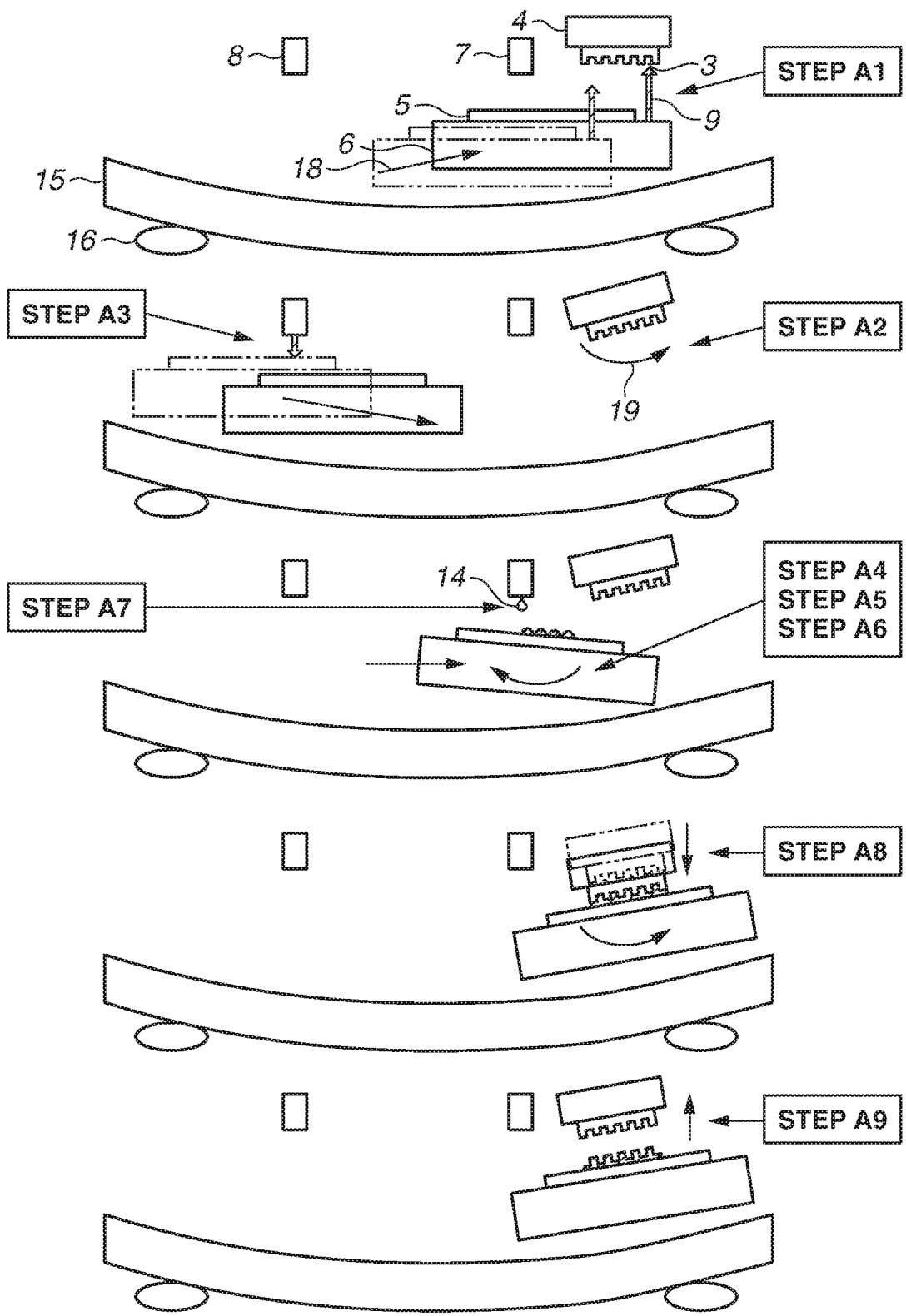
FIG. 7 is a conceptual diagram illustrating a substrate process according to the exemplary embodiment.
Figure 8A:
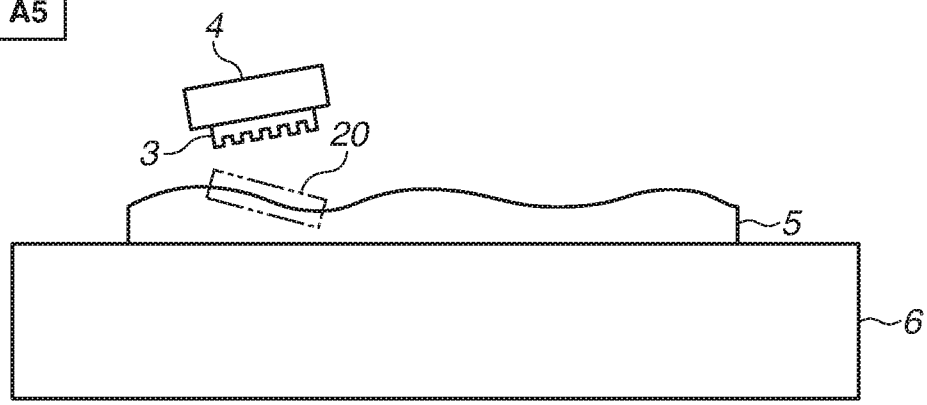
FIGS. 8A, 8B, and 8C each illustrate a process of correcting a tilt of a shot portion.
Figure 8B:
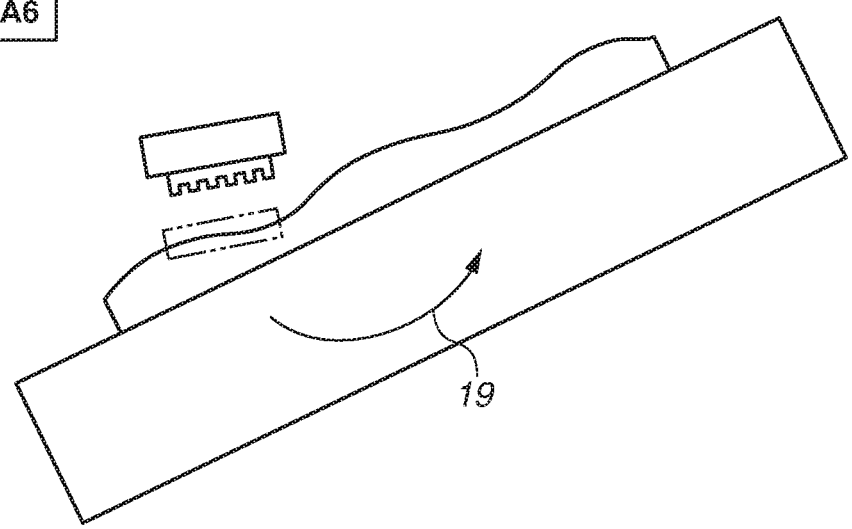
Figure 8C:
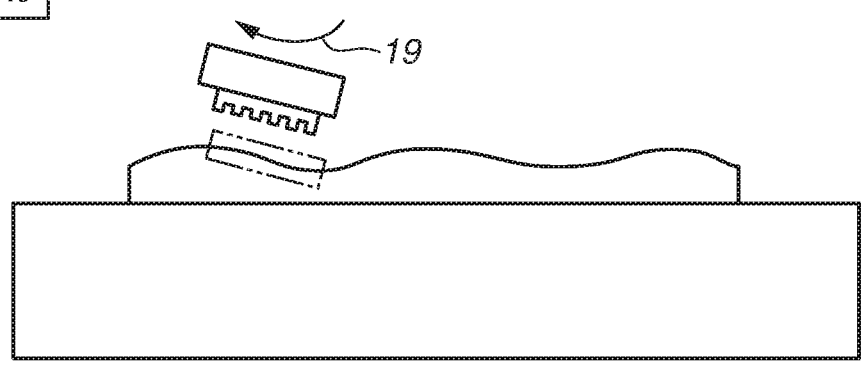

FIG. 7 illustrates an example where the substrate 5 is flat for simplicity of illustration. FIGS. 8A to 8C are supplementary explanatory diagrams in which the concave-convex pattern of the substrate surface is taken into consideration.

First, when the mold 3 for imprinting is mounted on the imprint head 4, in step A1, the tilt of the mold surface is measured. The height of the surface of the mold 3 can be measured by the mold height sensor 9 mounted on the substrate stage 6.

This process is repeated at a plurality of points on the mold surface by driving the substrate stage 6, thereby measuring the height distribution of the mold 3. In this case, the reference surface for the height distribution of the substrate 5 corresponds to the surface of the substrate stage base at the imprint position.

Next, in step A2, the correction of the tilt of the mold 3 is driven based on the tilt of the mold 3 obtained in step A1.

In the example illustrated in FIG. 7, the correction is implemented by tilting the imprint head 4 as shown by an arrow 19.

As a result, the mold surface is made parallel to the surface of the substrate stage base at the imprint position.

Next, in step A3, the substrate 5 is mounted on the substrate stage 6, and the height distribution of the substrate 5 is measured.

The substrate stage 6 is driven to the substrate height measurement position.

The substrate height at the measurement position on the substrate 5 is measured by the substrate height sensor 8.

The substrate height is measured at a plurality of positions on the substrate 5, thereby measuring the height distribution of the entire substrate 5.

The reference for the height distribution used in this case corresponds to the surface of the substrate stage base at the substrate height measurement position.

The mold 3 and the substrate 5 can be carried into the imprint apparatus 1 at any timing as long as the operation of carrying the mold 3 and the substrate 5 into the imprint apparatus 1 is completed before each measurement is started. Accordingly, the timing of carrying the mold 3 and the substrate 5 into the imprint apparatus 1 is not limited to the timing described herein.

Next, in step A4, the difference between the substrate surface shape (height distribution) at the substrate height measurement position obtained in step B3 and the substrate surface shape (height distribution) at the imprint position is added to or subtracted from the substrate surface shape (height distribution) at the substrate height measurement position (non-contact position) obtained in step A3.

As a result, the current substrate height distribution at the contact position (imprint position) can be obtained.

In step A5, the tilt of the substrate surface in the shot portion to be imprinted is calculated as illustrated in FIG. 8A.

A shot portion 20 to be imprinted is clipped based on the height distribution of the substrate 5 at the imprint position that is obtained in step A4, and a first-order plane approximation or the like is carried out on the shot portion 20, to thereby calculate the tilt of the shot portion 20. FIG. 8A illustrates this process conceptually.

In step A6, the correction of the tilt of the shot portion 20 obtained in step A5 is driven to make the shot portion 20 on the substrate 5 parallel to the mold 3.

FIG. 8B illustrates an example where the substrate stage 6 is driven to be tilted. To facilitate intuitive understanding, FIG. 7 also illustrates this example.

As illustrated in FIG. 8C, step A6 may be implemented by driving to tilt the imprint head 4. In this case, there is no need for the substrate stage 6 to be provided with a tilt driving mechanism, which is advantageous in that the imprint apparatus 1 can be manufactured at a low cost.

In step A7, the curable composition is coated on the substrate surface.

In this step, the curable composition is coated on the shot portion to be imprinted.

In step A8, the mold surface is pressed against the curable composition coated on the substrate 5 by moving the imprint head 4 downward. The curable composition is cured with exposure light, heat, or the like after a lapse of period in which the curable composition is filled in the pattern of the mold 3.

In general, during this process, die-by-die alignment in which the mold 3 and the substrate 5 are aligned by an alignment scope is carried out.

The same advantageous effects as those described above can also be obtained by performing imprinting while moving the substrate stage 6 upward, instead of moving the imprint head 4 downward.

In step A9, the mold 3 is separated from the curable composition on the substrate 5. As a result, the curable composition on which the pattern of the mold 3 is transferred is left on the substrate 5.

Steps A5 to A9 may be desirably repeated for all shot portions on the substrate 5. After completion of imprinting for all shot portions, the process from step A3 is repeated by replacing the substrate 5.

As described above, even when the surface of the substrate stage base at the substrate height measurement position is different from the surface of the substrate stage base at the imprint position, the application of the present invention makes it possible to press the mold 3 and the substrate 5 in parallel.

In the present exemplary embodiment, the order of steps in the flowchart illustrated in FIG. 5 is not fixed, but instead may be changed as long as no inconsistency occurs. The step number of each step is not intended to fix the order of steps, and the step number merely indicates a reference number.

In another exemplary embodiment, it is possible to provide a unit that directly measures the height distribution of the substrate 5 at the imprint position by using a probe according to the present exemplary embodiment, instead of measuring the height distribution of the substrate 5 by using the substrate height sensor 8.

In this process, steps A3 and A4 illustrated in the flowchart of FIG. 5 are replaced by step B2.

In this case, the replacement of the mold 3 every time the substrate 5 is processed requires time and labor. However, in this case, there is no need for the substrate height sensor 8 and there is no need for the substrate stage 6 to be driven to the position of the substrate height sensor 8, which is advantageous in making the imprint apparatus 1 compact at a low cost.

Alternatively, the present exemplary embodiment can also be used for, for example, an experiment for taking the correlation between the substrate surface, penetration of the curable composition, an unfilled portion, and the like.

As described above, in the present exemplary embodiment, the use of a mold with a small mesa portion as a mold for adjustment makes it possible to more accurately perform imprinting in a state where the substrate and the mold are in parallel.

Ideally, the mesa portion of the mold for adjustment has the same area and the same shape as those of the substrate height sensor 8. However, the advantageous effects of the present invention can be fully obtained if the size of the mesa portion of the mold for adjustment is sufficiently smaller than the spatial frequency component of the concave-convex pattern of the substrate surface or the surface of the stage base.

If the portion in contact with the substrate 5 is a flat surface, the mesa portion of the substrate for adjustment may have a circular shape or a polygonal shape. In this case, the tip end of the portion has a cylindrical shape or a prismatic shape. The area of the shape is desirably approximately several mm-square or approximately several cm-square. Alternatively, the tip end of the terminal may have a semispherical shape, a conical shape, or a pyramidal shape so that the tip end of the terminal comes into point contact with the substrate 5.

<Exemplary Embodiment of Article Manufacturing Method>

A method of manufacturing an article according to an exemplary embodiment of the present invention is suitable for, for example, manufacturing an article such as an element including a microdevice or microstructure, such as a semiconductor device. The method of manufacturing the article according to the present exemplary embodiment includes a step of forming a pattern on an imprint material supplied (coated) onto a substrate by the above-described imprint apparatus 1 (imprint method), and a step of processing the substrate having the pattern formed thereon in the previous step. Further, the manufacturing method includes other known steps (oxidation, deposition, vapor deposition, doping, planarization, etching, resist removal, dicing, bonding, packaging, etc.). The method of manufacturing an article according to the present exemplary embodiment is advantageous in at least one of the article performance, quality, productivity, and production cost, as compared with the method of related art.

A pattern of a cured product formed using the imprint apparatus 1 is permanently used for at least some of various articles, or is temporarily used to manufacture various articles. Examples of the article include an electric circuit element, an optical element, a microelectromechanical system (MEMS), a recording element, a sensor, and a mold. Examples of the electric circuit element include volatile or nonvolatile semiconductor memories, such as a dynamic random access memory (DRAM), a static RAM (SRAM), a flash memory, and a magnetoresistive RAM (MRAM), and semiconductor elements such as a large-scale integration (LSI), a charge-coupled device (CCD), an image sensor, and a field-programmable gate array (FPGA). Examples of the mold include a mold for imprinting.

The pattern of the cured product is directly used as at least some of components of the article, or is temporarily used as a resist mask. The resist mask is removed after etching, ion implantation, or the like is carried out in a substrate processing step.

Figure 9A:
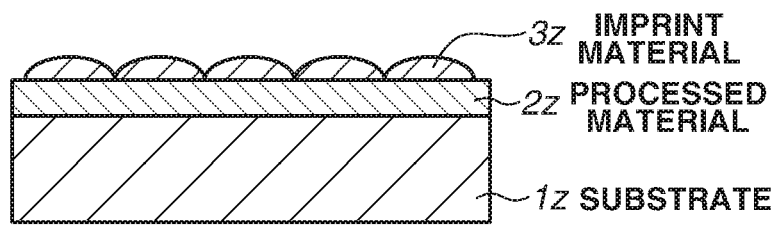
FIGS. 9A to 9F each illustrate an article manufacturing method.

Next, a specific method of manufacturing an article will be described. As illustrated in FIG. 9A, a substrate 1z, such as a silicon wafer, having a processed material 2z, such as an insulator, formed thereon is prepared. Then an imprint material 3z is applied to the surface of the processed material 2z by an inkjet method or the like. FIG. 9A illustrates a state where the imprint material 3z, which is in the form of a plurality of droplets, is applied onto the substrate 1z.

Figure 9B:
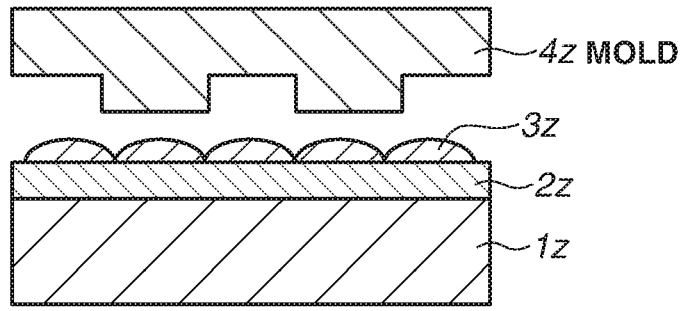
Figure 9C:
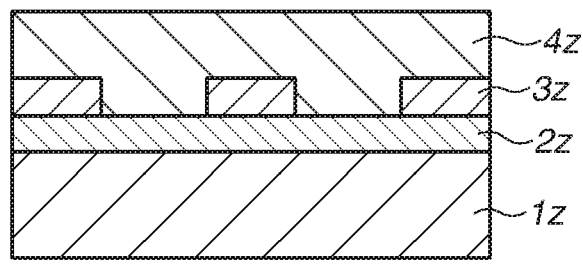

As illustrated in FIG. 9B, a mold 4z for imprinting is disposed to be opposed to the imprint material 3z with the surface having the concave-convex pattern formed thereon facing the imprint material 3z above the substrate 1z. As illustrated in FIG. 9C, the substrate 1z to which the imprint material 3z is applied is brought into contact with the mold 4z, and then a pressure is applied to the substrate 1z and the mold 4z. The imprint material 3z is filled in a gap between the mold 4z and the processed material 2z. In this state, the imprint material 3z is irradiated with light as energy for curing through the mold 4z, so that the imprint material 3z is cured.

Figure 9D:
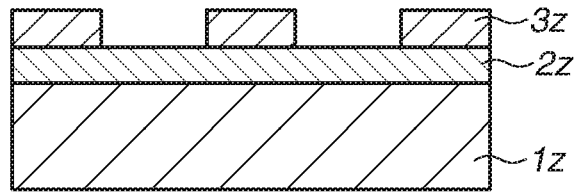

As illustrated in FIG. 9D, when the mold 4z is separated from the substrate 1z after the imprint material 3z is cured, the pattern of the cured product of the imprint material 3z is formed on the substrate 1z. The pattern of the cured product has a shape in which a concave portion of the mold 4z corresponds to a convex portion of the cured product and a convex portion of the mold 4z corresponds to a concave portion of the cured product. In other words, the concave-convex pattern of the mold 4z is transferred onto the imprint material 3z.

Figure 9E:
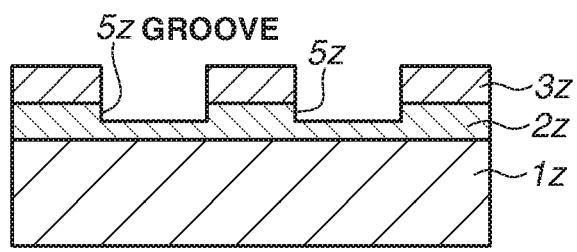
Figure 9F:
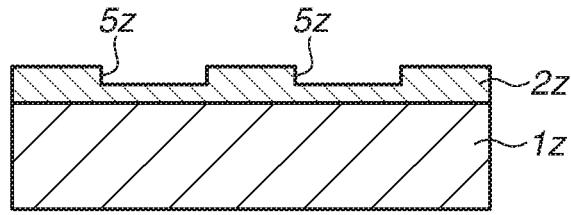

As illustrated in FIG. 9E, when the pattern of the cured product is used as etching-resistant mask in etching, a portion having no cured product or a portion having a thin cured product on the surface of the processed material 2z is removed, and the removed portion corresponds to each groove 5z. As illustrated in FIG. 9F, when the pattern of the cured product is removed, the article in which the grooves 5z are formed on the surface of the processed material 2z can be obtained. In this case, the pattern of the cured product is removed. However, instead of removing the pattern of the cured product after the processing, the pattern of the cured product may be used as, for example, a film for interlayer isolation included in the semiconductor elements and the like, or a component of the article.

Preferred exemplary embodiments of the present invention have been described above. However, the present invention is not limited to the exemplary embodiments described above and can be modified or changed in various ways within the scope of the invention.

According to an aspect of the present invention, it is possible to more accurately obtain a distribution of concave-convex portions of a surface of a substrate at a contact position. This makes it possible to more accurately make a substrate surface and a mold parallel to each other. Consequently, an improvement in production yield and an improvement in productivity can be attained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-073610, filed Apr. 8, 2019, which is hereby incorporated by reference herein in its entirety.

What is claimed is:

1. An imprint apparatus that forms a curable composition on a substrate using a mold, the imprint apparatus comprising:
a first measurement unit including holding mechanism of a probe, configured to measure a first height distribution of the substrate at a contact position where the mold and the curable composition are in contact with each other,
a substrate height sensor configured to measure a second height distribution of the substrate at a non-contact position different from the contact position,
a control device configured to control the first measurement unit and the substrate height sensor,
wherein the first measurement unit measures a height of the substrate by bringing the probe into contact with a surface of the substrate, the probe having a contact surface area smaller than a contact surface area of the mold, and
the control device is configured to correct a tilt of the substrate at the contact position based on the first height distribution and the second height distribution.

2. The imprint apparatus according to claim 1, wherein the non-contact position is located at a position remote from a mechanism configured to bring the mold and the curable composition into contact with each other to prevent interference of the non-contact position with the mechanism.

3. The imprint apparatus according to claim 1, wherein the holding mechanism is configured to hold the mold.

4. The imprint apparatus according to claim 3, wherein the holding mechanism is caused to hold the probe in a case where the height distribution of the substrate at the contact position is to be measured, and the holding mechanism is caused to hold the mold in a case where the mold and the curable composition are in contact with each other.

5. The imprint apparatus according to claim 1, wherein the control device further calculates a difference between the second height distribution of the substrate at the non-contact position and the first height distribution of the substrate at the contact position.

6. The imprint apparatus according to claim 1, wherein a tip end of the probe has one of a semispherical shape, a cylindrical shape, a conical shape, a pyramidal shape, and a prismatic shape.

7. The imprint apparatus according to claim 1, wherein substrate height sensor is an optical height measurement sensor.

\* \* \* \* \*